United States Patent
Pschenitzka (10) Patent No.: US 11,004,835 B2
(45) Date of Patent: May 11, 2021

(54) LIGHT-EMITTING DIODES WITH LIGHT COUPLING AND CONVERSION LAYERS

(71) Applicant: Kateeva, Inc., Newark, CA (US)

(72) Inventor: Florian Pschenitzka, San Francisco, CA (US)

(73) Assignee: Kateeva, Inc., Newark, CA (US)

( * ) Notice: Subject to any disclaimer, the term of this patent is extended or adjusted under 35 U.S.C. 154(b) by 0 days.

(21) Appl. No.: 16/527,753

(22) Filed: Jul. 31, 2019

(65) Prior Publication Data

US 2020/0051959 A1   Feb. 13, 2020

Related U.S. Application Data (60) Provisional application No. 62/716,881, filed on Aug. 9, 2018.

(51) Int. Cl.
| | |
|---|---|
| *H01L 25/075* | (2006.01) |
| *H01L 33/32* | (2010.01) |
| *H01L 33/50* | (2010.01) |

(52) U.S. Cl.
CPC .......... *H01L 25/0753* (2013.01); *H01L 33/32* (2013.01); *H01L 33/504* (2013.01); *H01L 33/505* (2013.01); *H01L 33/508* (2013.01); *H01L 2933/0041* (2013.01); *H01L 2933/0091* (2013.01)

(58) Field of Classification Search
CPC combination set(s) only.
See application file for complete search history.

(56) References Cited

U.S. PATENT DOCUMENTS

| | | | |
|---|---|---|---|
| 8,450,748 B2 | 5/2013 | Su et al. | |
| 2010/0001299 A1* | 1/2010 | Chang | F21K 9/00 257/89 |
| 2010/0193806 A1* | 8/2010 | Byun | H01L 33/507 257/88 |
| 2014/0367633 A1* | 12/2014 | Bibl | H01L 25/0753 257/13 |
| 2015/0028365 A1* | 1/2015 | Kurtin | C09K 11/025 257/88 |
| 2015/0109319 A1 | 4/2015 | Yata et al. | |
| 2016/0372514 A1 | 12/2016 | Chang et al. | |
| 2018/0102449 A1* | 4/2018 | Pschenitzka | C09D 11/322 |
| 2018/0308915 A1* | 10/2018 | Motoyama | H01L 27/322 |

FOREIGN PATENT DOCUMENTS

WO   2020/033206 A1   2/2020

OTHER PUBLICATIONS

International Search Report and Written Opinion dated Nov. 26, 2019 to PCT Application PCT/US19/44407.

* cited by examiner

*Primary Examiner* — Nduka E Ojeh
(74) *Attorney, Agent, or Firm* — Hauptman Ham, LLP (57) ABSTRACT

Light-emitting sub-pixels and pixels for micro-light-emitting diode-based displays are provided. Also provided are methods of fabricating individual sub-pixels, pixels, and arrays of the pixels. The sub-pixels include a double-layered film that includes a coupling layer disposed over a light-emitting diode and a light-emission layer disposed over the coupling layer.

23 Claims, 6 Drawing Sheets

LIGHT-EMITTING DIODES WITH LIGHT COUPLING AND CONVERSION LAYERS

CROSS-REFERENCE TO RELATED APPLICATIONS

The present application claims priority to U.S. provisional patent application No. 62/716,881 that was filed on Aug. 9, 2018, the entire contents of which are incorporated herein by reference.

BACKGROUND

The pixels in a color conversion display device include a color converting layer over an excitation source, such as a light emitting diode. The color converting layers typically include phosphors that are capable of converting light from the excitation source into a different color. For example, the light from a blue excitation source can be converted into red light or green light using appropriate phosphors, to provide a full color display based on red, green, and blue (RGB) sub-pixels. However, the production of color conversion devices is hampered by several manufacturing challenges. For example, heat-sensitive phosphors, such as quantum dots, in the color converting layer are exposed to the heat generated by the excitation source, which shortens their useful lifetimes. In addition, many color display device fabrication processes require pixels or sub-pixels to be fabricated separately and then fused into a display. In many cases, this further includes a binning step to sort and group the pixels or sub-pixels by their emission properties, thereby rendering the manufacturing process inefficient.

SUMMARY

Light-emitting pixels for light-emitting diode-based displays are provided. Also provided are methods of fabricating individual pixels and arrays of pixels.

One embodiment of a pixel includes: a substrate; a red sub-pixel on the substrate; a green sub-pixel on the substrate; and a blue sub-pixel on the substrate. The red sub-pixel includes: a first light-emitting diode; a first coupling layer disposed over the first light-emitting diode; and a red light-emission layer comprising red-emitting quantum dots and scattering particles disposed in a polymeric matrix disposed over the first coupling layer. The green sub-pixel includes a second light-emitting diode; a second coupling layer disposed over the second light-emitting diode; and a green light-emission layer comprising green-emitting quantum dots and scattering particles disposed in a polymeric matrix disposed over the second coupling layer. The blue sub-pixel includes a third light-emitting diode.

In some embodiments of the pixels, the coupling layers include scattering particles disposed in a polymeric matrix. In these embodiments, the coupling layers can be referred to as light scattering layers. In other embodiments, the coupling layers are dome-shaped features that improve the light coupling between the light-emitting diode and the light-emission layer by providing a curved interface that reduces the internal reflection of light from the LED relative to the internal reflection of light that would occur at the LED/light-emission layer interface in the absence of the coupling layer. Some embodiments of the coupling layers are dome-shaped and include scattering particles disposed in a polymeric matrix.

One embodiment of a method of forming a pixel on a substrate having a first light emitting-diode, a second light-emitting diode, and a third light-emitting diode includes: forming a first sub-pixel confinement feature over the first light-emitting diode; depositing a first film-forming ink composition comprising curable organic monomers into or onto the first sub-pixel confinement feature over the first light-emitting diode; curing the first film-forming ink composition to form a first coupling layer; depositing a first quantum dot-containing ink composition comprising red-emitting quantum dots, scattering particles, and curable organic monomers into or onto the first sub-pixel confinement feature; curing the first quantum dot-containing ink composition to form a red light-emission layer comprising red-emitting quantum dots and scattering particles disposed in a polymeric matrix; forming a second sub-pixel confinement feature over the second light-emitting diode; depositing a second film-forming ink composition comprising curable organic monomers into or onto the second sub-pixel confinement feature over the second light-emitting diode; curing the second film-forming ink composition to form a second coupling layer; depositing a second quantum dot-containing ink composition comprising green-emitting quantum dots, scattering particles, and curable organic monomers into or onto the second sub-pixel confinement feature; and curing the second quantum dot-containing ink composition to form a green light-emission layer comprising green-emitting quantum dots and scattering particles disposed in a polymeric matrix. In embodiments of the displays that include scattering particles in the coupling layers, the film-forming inks will include scattering particles in addition to the curable organic monomers. The sub-pixel confinement features can be formed simultaneously or sequentially in the method described above.

One embodiment of a method of forming a display includes: forming a plurality of pixels on a semiconductor substrate, each pixel comprising a red sub-pixel, a green sub-pixel, and a blue sub-pixel; dicing the substrate into pieces, each of the pieces comprising one or more, but not all, of the pixels; and transferring one or more of the pieces to a display substrate. The pixels are formed by: forming a first light-emitting diode, a second light-emitting diode, and a third light-emitting diode on the semiconductor substrate; forming a first sub-pixel confinement feature over the first light-emitting diode; forming a second sub-pixel confinement feature over the second light-emitting diode; optionally, forming a third sub-pixel confinement feature over the third light-emitting diode; forming a red light-emission layer over the first light-emitting diode in the first pixel confinement feature by depositing an ink composition comprising red-emitting quantum dots into or onto the first pixel confinement feature and drying the ink composition into a solid film to provide the red sub-pixel; forming a green light-emission layer over the second light-emitting diode in the second pixel confinement feature by depositing an ink composition comprising green-emitting quantum dots into or onto the second pixel confinement feature and drying the ink composition into a solid film to provide the green sub-pixel; and, optionally, forming a blue light-emission layer over the third light-emitting diode in the third pixel confinement feature by depositing an ink composition comprising blue-emitting quantum dots into or onto the blue pixel confinement feature and drying the ink composition into a solid film.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

DETAILED DESCRIPTION

Light-emitting pixels for micro-light-emitting diode (μLED) based displays are provided. Also provided are methods of fabricating individual pixels and arrays of pixels.

Figure 1:
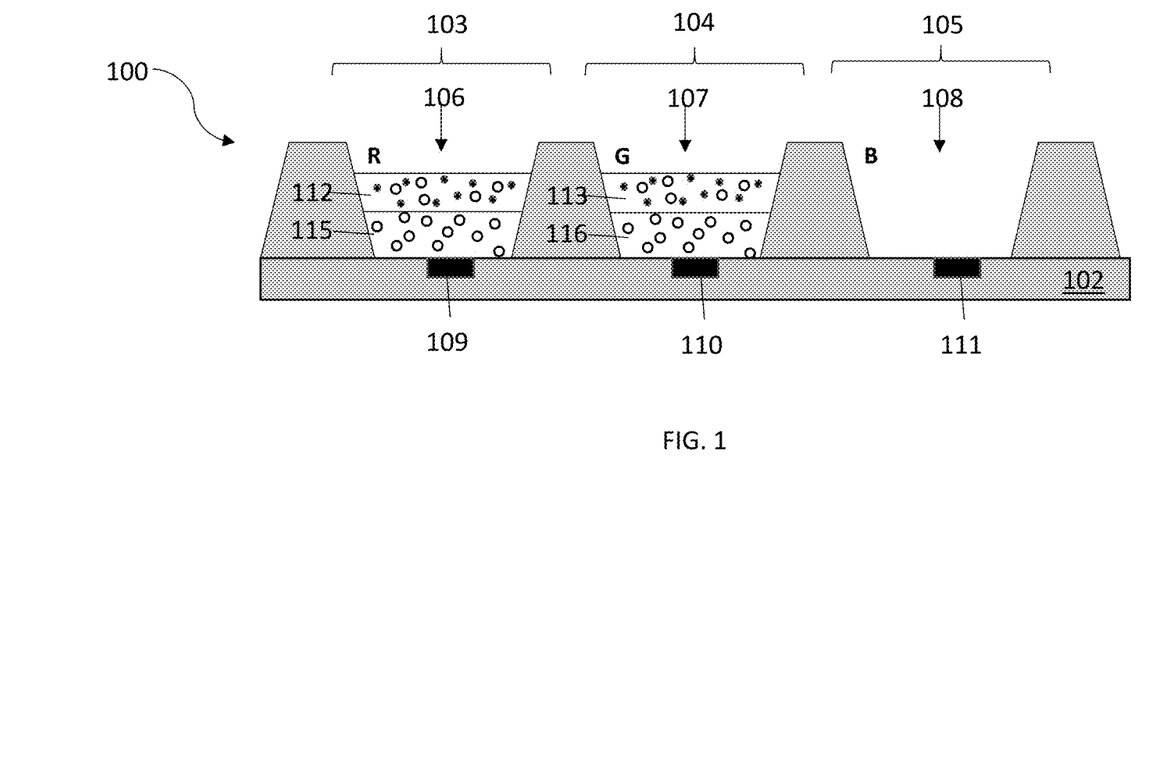
FIG. 1 is a schematic diagram showing a cross-sectional view of one embodiment of a pixel that includes light scattering layers and light-emission layers over the light-emitting diodes of the sub-pixels.

A basic embodiment of a pixel is shown in FIG. 1. In this embodiment, the pixel 100 includes: a substrate 102; a red (R) sub-pixel 103; a green (G) sub-pixel 104; and a blue (B) sub-pixel 105. Each of the sub-pixels is defined by a pixel well (106, 107, 108). There is a first LED 109 in a first pixel well 106, a second LED 110 in a second pixel well 107, and a third LED 111 in a third pixel well 108. The LEDs can be, for example, blue LEDs or ultraviolet (UV) LEDs. Blue LEDs include gallium nitride (GaN) based LEDs which can integrated into a GaN substrate wafer using known epitaxial growth and lithographic patterning techniques. However, other inorganic LEDs can be used, including other Group III-nitride semiconductors.

Over the LEDs in the red sub-pixel and the green sub-pixel is a double-layered film that includes a scattering layer (115, 116) disposed over the LED and a light-emission layer (112, 113) disposed over the scattering layer. This double-layered film is capable of transmitting light in the visible region of the electromagnetic spectrum. Although not shown in FIG. 1, in some embodiments of the pixels, including embodiments in which the LEDs are UV LEDs, the blue sub-pixel also includes a double-layered film that includes a scattering layer disposed over the LED and a light-emission layer disposed over the scattering layer. By providing an intervening light scattering layer between the LED and the light-emission layer, heat-sensitive phosphors, such as quantum dots, in the light-emission layer are shielded from the heat generated by the LED, which prolongs their useful lifetimes.

The scattering layers include scattering particles (represented as open circles in FIGS. 1, 2B, and 3) disposed in a polymeric matrix. The scattering particles provide enhanced light extraction by acting as light scattering centers for light from the underlying LED. These scattering particles reduce the amount of light waveguided in the device and thus increase the light outcoupling of the device. Because the light coming from the LEDs can be very directional, the light flux for light entering the light scattering layer may be higher directly above the LED relative to more peripheral locations. By scattering the light, the scattering particles create a more uniform light flux, which facilitates a more uniform device degradation and thus prolongs the useful lifetime of the device.

The scattering particles (abbreviated SPs), may be geometric scattering particles (abbreviated GSPs), plasmonic scattering nanoparticles (abbreviated PSNPs), or a combination thereof. It should be noted that, although the PSNPs will generally have at least one nanoscale dimension—that is, at least one dimension of not greater than about 1000 nm—the nanoparticles need not be round particles. For example, the nanoparticles can be elongated particles, such as nanowires, or irregularly shaped particles. The GSPs may also be, but need not be, nanoparticles. Scattering by GSPs is accomplished by refraction at the surface of the particle. Examples of GSPs include metal oxide particles, such as particles of zirconium oxide (i.e., zirconia), titanium oxide (i.e., titania), and aluminum oxide (i.e., alumina). A PSNP is characterized in that incident light excites an electron density wave in the nanoparticle that creates a local oscillating electric field extending out from the surface of the nanoparticle. Examples of PSNPs include metal nanoparticles, such as nanoparticles of silver.

Figure 2A:
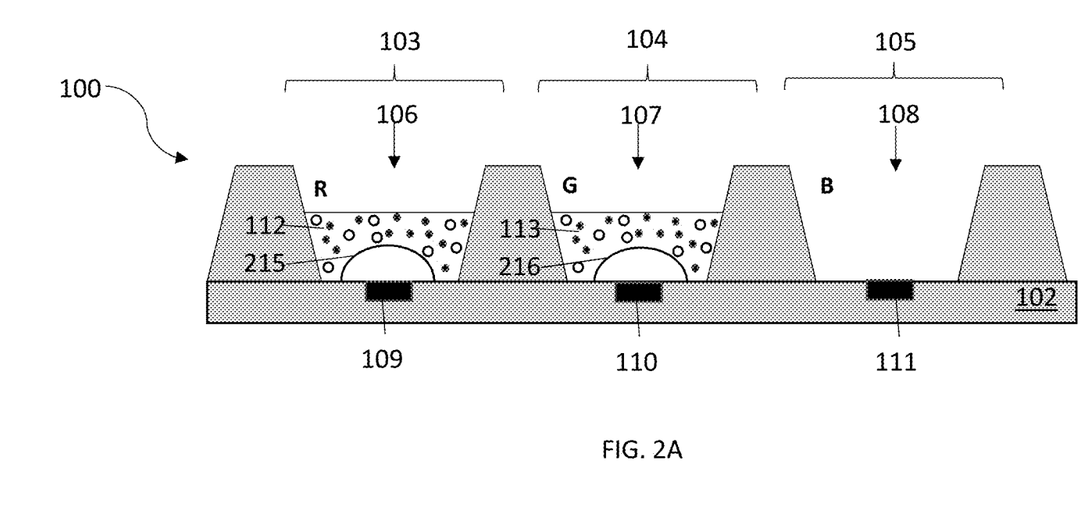
FIG. 2A is a schematic diagram showing a cross-sectional view of another embodiment of a pixel in which dome-shaped coupling layers are localized over the light-emitting diodes.
Figure 2B:
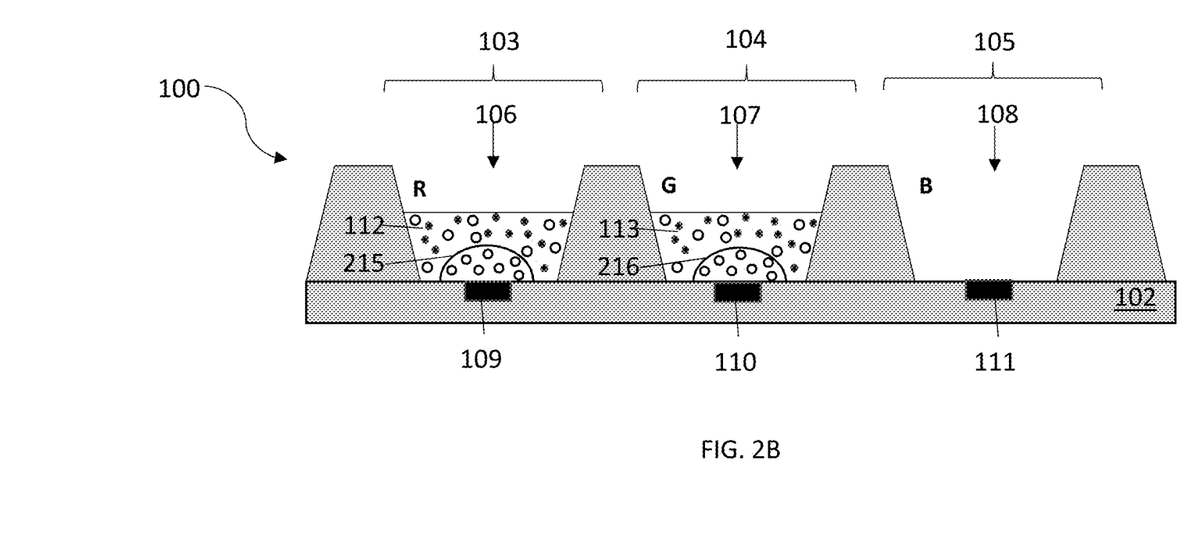
FIG. 2B is a schematic diagram of the pixel of FIG. 2A in which the dome-shaped coupling layers include scattering nanoparticles.

Other embodiments of pixels are shown in FIG. 2A and FIG. 2B. In the embodiment of FIG. 2A, the LEDs (109, 110) of sub-pixels 103 and 104 are separated from their light-emission layers (112, 113) by dome-shaped coupling layers 215 and 216. These coupling layers create a curved interface where the coupling layer meets the light-emission layer, which serves to reduce the internal reflection of light from the LED relative to the internal reflection of light that would occur at the LED/light-emission layer interface in the absence of the coupling layer or in the presence of a planar coupling layer. In order to minimize the internal reflection, the coupling layer is desirably formed from a polymer having a refractive index that is the same as, or nearly as high as, that of the underlying LED. In the embodiment of FIG. 2B, coupling layers (215, 216) include scattering particles disposed in the polymeric matrix to enhance light scattering, as described above. For example, the scattering particles can be dispersed in the polymeric matrix. Although uniform dispersion of the particles in the matrix is desired, the dispersion need not be perfectly uniform and a small amount of particle aggregation is typically tolerable.

The light-emission layers include phosphor particles and/or phosphor molecules and, optionally, scattering particles disposed in (e.g., dispersed in) in a polymeric matrix. In some embodiments, the phosphors are quantum dots. However, other phosphors can be used, such as potassium fluorosilicate. In the embodiments of the pixels shown in FIGS. 1-3, quantum dots are represented by solid circles. The scattering particles in the light-emission layers may the same as, or different from, the scattering particles in the scattering layers. Quantum Dots (QDs) are small crystalline, inorganic particles that absorb incident radiation having a first wavelength, or a first range of wavelengths, and convert the energy of the radiation into light having a different wavelength, or a different range of wavelengths, which is emitted from the QDs within a very narrow part of the optical spectrum. The wavelengths of radiation absorbed and emitted by the QDs depend on their size. Thus, by incorporating QDs of appropriates sizes and materials in appropriate concentrations and ratios into a light-emission layer, that layer can be designed to absorb the light emitted by the LED that has passed through the light coupling/ scattering layer and convert at least a portion of it into radiation of different wavelengths. For the purposes of this disclosure, QDs that absorb light emitted by the LED and convert it into red light are referred to as red-emitting QDs, QDs that absorb light emitted by the LED and convert it into green light are referred to as green-emitting QDs, and QDs that absorb light emitted by the LED and convert it into blue light are referred to as blue-emitting QDs.

Figure 3:
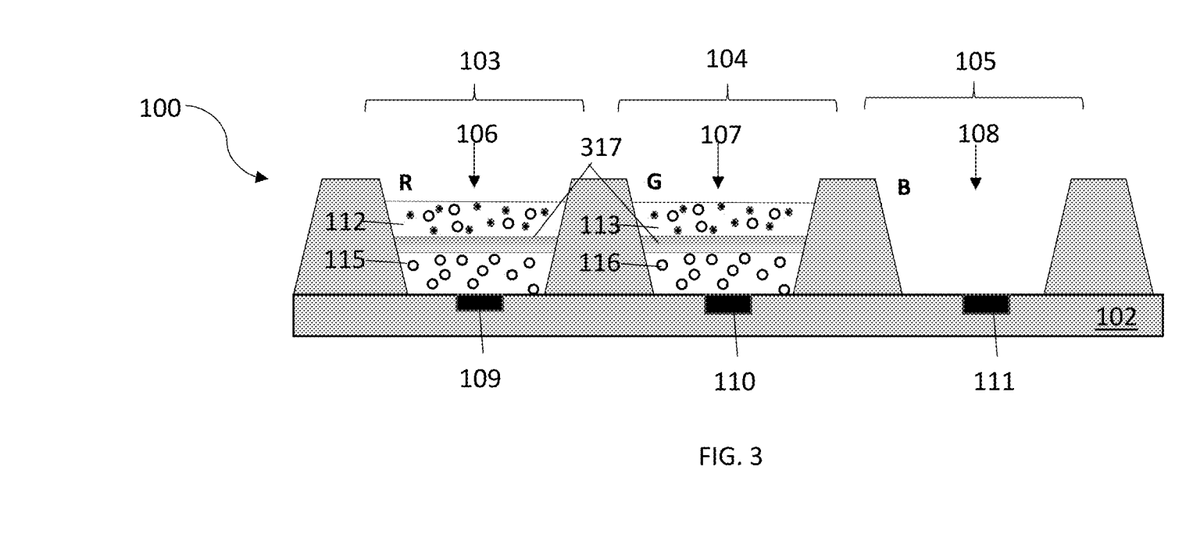
FIG. 3 is a schematic diagram showing a cross-sectional view of another embodiment of a pixel in which the light scattering layers and light-emission layers of the double-layered films are joined by a gradient interface region.

Although the pixels depicted in the FIGS. 1-3 include three sub-pixels, the pixels can contain more or fewer sub-pixels. For example, a pixel can contain four sub-pixels, including a white sub-pixel. Alternatively, a pixel can contain two sub-pixels independently selected from red, green, blue, and white sub-pixels.

The use of a QD-containing light-emission layer to produce sub-pixels of different colors is advantageous because it yields sub-pixels having very uniform light-emission properties. In contrast, conventional methods of forming LEDs having dedicated colors (red, green, or blue LEDs) tend to produce LEDs having spectral variations in their light emission. As a result, it is necessary to sort the LEDs of a given color by their emission properties and then to combine those having the same, or very similar, emission properties into batches. This process is called binning. Binning adds time, complexity, and expense to the fabrication process. In contrast, the present pixel design allows for the monolithic integration of red, green, and blue sub-pixels without the need for binning the LEDs, although a binning step may be employed for the blue LEDs used in the blue sub-pixels in embodiments where no QD-containing light-emission layer is utilized.

In some embodiments of the pixels, the light-emission layers are free of SPs. However, including the SPs can be advantageous. Utilizing SPs in combination with the QDs in the light-emission layers can increase the color conversion efficiency of the sub-pixels by increasing photon scattering in the interior of the light-emission layer, so that there are more interactions between the photons and the QDs and, therefore, more light absorption and conversion by the QDs. With respect to PSNPs, in addition to the light scattering effect that they provide in the light-emission layer, if the PSNP is in close proximity to one or more QDs in the light-emission layer, their electric fields can couple to the QDs, thereby enhancing the absorption and conversion of light by the QDs in the layer.

If the LED is a blue LED, the double-layered film can be omitted from the blue sub-pixel, since light color conversion is not needed. However, even in embodiments of the pixels that do not include a blue light-emission layer in the blue sub-pixel, a light scattering layer may be provided over the LED in order to provide isotropic blue light emission from the blue sub-pixels that is equivalent to, or nearly equivalent to, the isotropic red and green light emission that is provided by the red and green sub-pixels, such that the optical appearance of the emitted blue light (e.g., haze and specular emission) is similar to that of the emitted red and green light. Optionally, the blue sub-pixel can be at least partially filled with a polymer matrix that at least partially transmits the blue light from the blue LED at the base of the blue sub-pixel.

Optionally, the pixels and pixel arrays can have a protective layer disposed over all or a portion of their exposed surfaces to protect the pixels from mechanical and/or environmental damage. The protective layer can be a thick layer that covers all or part of the QD-containing light-emission layer. For example, the protective layer can be between about 1 μm to about 100 μm in thickness. The protective layer can be a glass layer, a polymeric film, such as polyethylene terephthalate (PET), an acrylate-based polymeric film, or the like, or an inorganic barrier layer, or a combination of the two. At least a portion of the protective layer should be translucent, meaning that it is capable of transmitting at least some of the light, and desirably most of the light, emitted from the sub-pixels; however, 100% transmittance is not required.

The coupling layers, including the light scattering layers, and the light emission layers can be formed in a sub-pixel by including their respective components in an ink composition, depositing the ink composition into a sub-pixel well using, for example, inkjet printing, and drying and/or curing the printed ink composition into a solid film. As used herein, the term drying refers to the process of removing volatile components from the ink composition, such as solvents and/or water, by evaporation with optional heating or exposure to vacuum. Curing refers to a process that includes the crosslinking of the monomer components in the ink compositions. Curing typically occurs along with drying for curable ink compositions. The various ink compositions described herein can be all be dried and any ink compositions that include curable components (e.g., curable monomers or oligomers) can be cured.

An effective scattering particle size in the range from about 40 nm to about 1 μm, depending on the type of scattering, can be selected for use in an inkjet jettable ink. However, for other deposition methods, larger scattering particles, including particles having diameters up to about 10 μm can be used. The GSPs will typically be larger than the PSNPs, and both types of particles will generally be larger than the QDs. By way of illustration only, in various embodiments of the ink compositions and the layers formed therefrom, the GSPs have an effective size in the range from about 100 nm to about 10 μm, and the PSNPs have an effective size in the range from about 10 nm up to 100 nm.

A substantially planar light scattering layer can be formed by using enough ink to fill the sub-pixel well laterally to form a flat layer across the well, as shown in FIG. 1. As used herein, the term substantially planar layer includes layers that are nearly, but not perfectly, planar across their surfaces, but also includes imperfect surfaces which are, for example, created due to pinning or material transport during the drying process. Alternatively, a curved coupling layer can be formed by using a volume of ink that does not entirely fill the sub-pixel well laterally but instead forms a layer that covers and is localized over the LED with a lower degree of coverage, or no coverage, at the periphery of the base of the sub-pixel well, as illustrated by the dome-shaped coupling layers (215, 216) in the red and green sub-pixel wells in FIGS. 2A and 2B.

In one embodiment of a process of forming a double-layered film over an LED in a sub-pixel well, the coupling layer is fully formed in the sub-pixel well prior to depositing the QD-containing ink composition into the sub-pixel well. This can be accomplished by depositing a film-forming ink composition that includes an organic binder material and, optionally, scattering particles and/or a solvent directly into the sub-pixel well over an LED at the base of the well. The organic binder material may be, for example, curable organic molecules. This ink composition is then cured or simply dried to form a coupling layer on the LED. The light-emission layer can be formed by depositing a QD-containing ink composition that includes quantum dots and an organic binder material and, optionally, scattering particles and/or a solvent over the coupling layer. This ink composition is then cured or simply dried to form a light-emission layer. The organic curable molecules in the ink compositions cure to form a matrix material and can include various organic monomers, oligomers, and/or polymers, as discussed in more detail below. In addition, the ink compositions can include a crosslinking agent, a photoinitiator, or both. Although the sub-pixels wells can have a variety of shapes, rectangular wells are suited for inkjet printing.

A plurality of the pixels can be formed in an array on a substrate to provide a light emitting layer of a display device, such as a color conversion full-color display device. The display devices may further include a protective, translucent protective layer over the pixel array and a pixel driver circuit array for controlling the pixels connected to the pixel array.

The ink composition that is used to form the light-emission layer can be deposited over the cured/dried coupling layer, as described immediately above. Alternatively, the ink composition that is used to form the light-emission layer can be deposited over the ink composition that is used to form the coupling layer before the latter ink composition is cured or dried into a solid film. Both ink compositions can then be dried and/or cured. In this embodiment the method, though some diffusion can occur between the two ink compositions prior to curing or drying, the ink compositions can be made sufficiently immiscible to prevent the complete or substantially complete mixing of the two ink compositions on the timescale of the desposition and curing/drying process. The inks can be rendered immiscible through, for example, the selection of solvents and/or monomers. If the ink compositions partially mix prior to curing/drying, the coupling layer and the light-emission layer may be joined at interfacial region 317, as shown schematically in FIG. 3, in which a quantum dot concentration gradient is created by the diffusion of quantum dots into the previously deposited coupling layer.

It is possible construct the pixels individually and then to assemble them in a display. Notably, for the reasons discussed above, this can be done without the need to bin the LEDs. However, it is more efficient to construct a plurality of the pixels on the same substrate. For example, a plurality of the pixels can be fabricated on a semiconductor substrate, such as a GaN wafer, which can then be diced to separate the pixels. Each pixel can be formed as a triplet of sub-pixels on the substrate, including a red, a green, and a blue sub-pixel, using a patterned phosphor layer (e.g., containing quantum dots) using, for example, inkjet printing techniques. The result is an array of monolithically integrated devices capable of emitting red, green, and blue radiation. After dicing, individual full-color pixels can be transferred and affixed to another substrate in a display device. Thus, another aspect of the invention described herein is a method for forming a display device. The method can be carried out using pixels in which one or more of the sub-pixels include a double-layered light coupling and emission layer, as described herein, but can also be carried out using pixels in which one or more of the sub-pixels include only a light-emission layer, without an underlying coupling layer. Forming the sub-pixels together on the same substrate eliminates the need to either: (a) fuse together sub-pixels formed on different substrates into an individual pixel before the transfer process; or (b) transfer the red, green, and blue sub-pixels separately. As a result, this method can greatly reduce the complexity of the transfer process.

Figure 4:
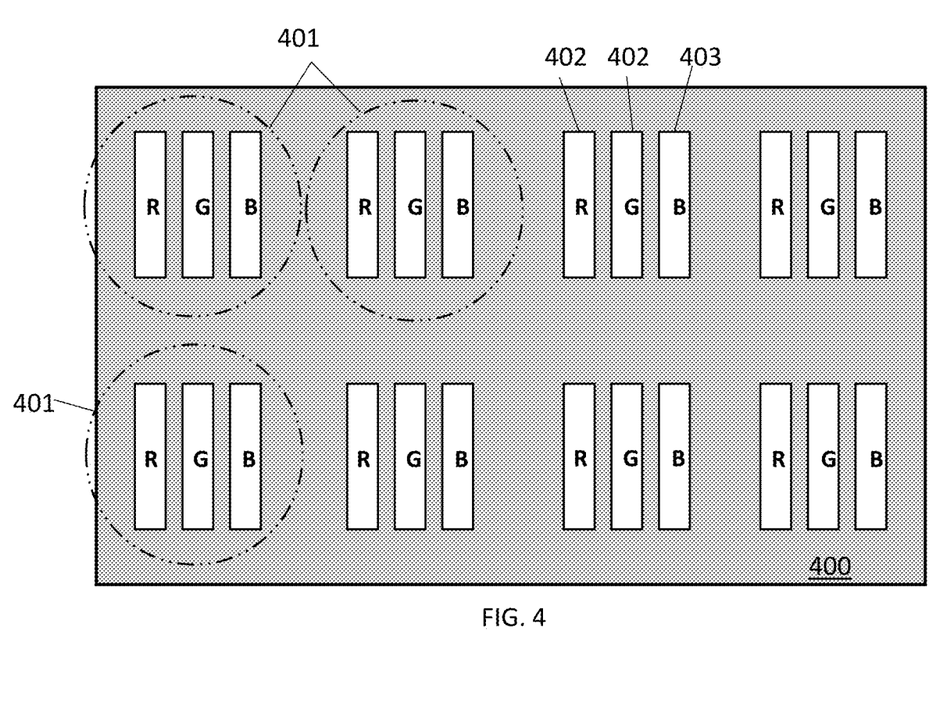
FIG. 4 is a schematic diagram showing a top view of a portion of a substrate having a plurality of pixels.

One embodiment of a method for forming a display includes forming a plurality of pixels on a semiconductor substrate 400, as shown schematically in FIG. 4, wherein each of the pixels 401 is composed of a grouping of a red sub-pixel 402, a green sub-pixel 403, and a blue sub-pixel 404. Each pixel is made by forming a group of three LEDs on the substrate. A first sub-pixel well is then formed over a first LED, and a second sub-pixel well is formed over the second LED, where the first LED can be any of the three LEDs in the group of three, and the second LED can be any other of the three LEDs in the groups of three. Optionally, a third sub-pixel well can be formed over the third LED. By "formed over" it is meant that the pixel well defines a perimeter around the LED on the substrate, such that the LED is at the base of the sub-pixel well. A red light-emission layer is formed over the first LED to form a red sub-pixel, and a green light-emission layer is formed over the second LED to form a green sub-pixel. If the LEDs are blue LEDs, it is not necessary to form a sub-pixel well or a blue light-emission layer over the blue sub-pixel, since light conversion is not necessary. However, these features may be included if blue emitting quantum dots would help to adjust the emission characteristics of the blue sub-pixel or if UV LEDs are used rather than blue LEDs. The light-emission layers and, if present, scattering layers can be formed by inkjet printing quantum dot and/or scattering particle-containing ink jettable ink compositions, as described herein.

The pixel well can be a physical well which contains the deposited ink. This well can be formed by a photolithography process on a polymeric layer. In this case, the photolithography process creates openings in the polymer layer, which then act as ink containment features. However, the features that confine the deposited ink compositions (confinement features) need not be physical wells (e.g., defined by a side-wall and a base). Instead, the confinement features can be any substrate structure and/or attribute that confines the ink compositions and prevents them from spreading beyond the boundaries of their sub-pixels. For example, a confinement feature can be provided by a local change in the surface energy on a wafer substrate. In that case, the ink confinement is achieved by the ink pinning on the substrate due to the local change in surface energy. No physical ink containment is present; the area of the substrate having the local change in surface energy serves as a confinement feature. In yet another option, the overall surface energy of the wafer is dialed-in such that the ink spreads in such a way that no physical pixel well is necessary because the surface energy of the wafer which provides containment provides the ink composition confinement. Thus, while the pixels described herein are illustrated by embodiments that use sub-pixel wells, the wells in those embodiments can be replaced by other confinement features.

Figure 5:
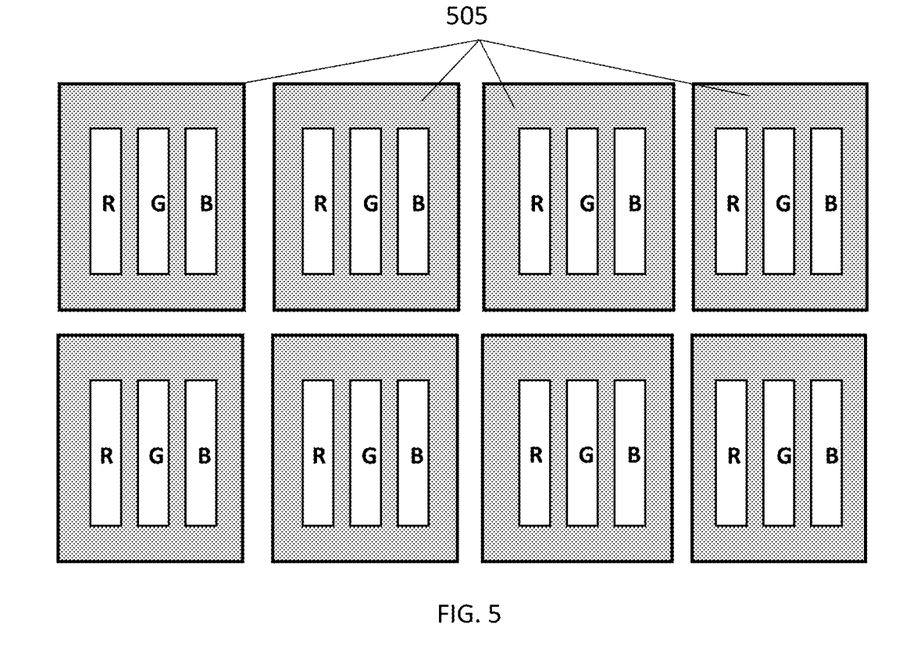
FIG. 5 is a schematic diagram of a top view of the substrate of FIG. 4 diced to form discrete pixels.

The semiconductor substrate (e.g., GaN wafer) is then diced into pieces 505 (FIG. 5), wherein each of the pieces include one or more (but not all) of the pixels that will make-up the display. For example, the pieces can each include single discrete pixels or a small number (e.g., 2 to 10) of pixels.

The deposition of the quantum dot-containing ink compositions into the sub-pixel wells can be done on the wafer-scale level prior to the dicing of the substrate, or the substrate can be diced prior to depositing the ink compositions into the sub-pixel wells. In the latter embodiment, the diced pieces can be temporarily held together for the subsequent deposition steps using an adhesive film. The pieces can then be transferred independently to a display device substrate, such as a backplane.

For high quality white light emission from a pixel, it is desirable for the light flux of the green emission to be the higher than that of the red emission and the blue emission. For example, it may be desirable for the green emission to be the highest and the blue emission to be the lowest. Therefore, the pixels can be designed such that the green sub-pixel has the highest emission surface area and the red and blue sub-pixels have the same size emission surfaces areas. Alternatively, the blue sub-pixel can have the smallest emission surface area. The emission surface area refers to the area of the surface through which the light exits the sub-pixel when the device is in operation. The area ratio between the sub-pixels can be optimized to achieve the required white point with the highest brightness and/or the best power efficiency.

Ink Compositions

The following teachings relate to various embodiments of ink compositions which, once printed and dried and/or cured, form thin polymeric layers, including the light coupling layers and light-emission layers described herein. Various embodiments of the ink compositions can be printed using, for example, an industrial inkjet printing system that can be housed in a gas enclosure. "Gas enclosure" is defined as an interior that has a controlled environment maintained as a clean and dry processing environment.

The compositions described herein are referred to as "ink compositions" because various embodiments of the compositions can be applied using techniques, including printing techniques, by which conventional inks have been applied to substrates. Such printing techniques include, for example, inkjet printing, screen printing, thermal transfer printing, flexographic printing, and/or offset printing. However, various embodiments of the ink compositions can also be applied using other coating techniques, such as, for example, spray coating, spin coating, and the like. Moreover, the ink compositions need not contain colorants, such as dyes and pigments, which are present in some conventional ink compositions.

Some embodiments of the ink compositions include a polymer and/or a polymer-forming component, for example, but not limited by, various acrylate monomers, such as mono- or multidentate acrylates; various methacrylate monomers, such as mono- or multidentate methacrylates; and copolymers and mixtures thereof. The polymer component can be cured using thermal curing (e.g., baking), UV curing, e-beam curing, and combinations thereof. As used herein, a polymer and copolymer can include any form of a polymer component that can be formulated into an ink and cured on a substrate to form an organic polymeric layer. Such polymeric components can include polymers and copolymers, as well as precursors thereof, for example, but not limited by, monomers, oligomers, and resins.

Some embodiments of the ink compositions include one or more mono(meth)acrylate monomers, one or more di(meth)acrylate monomers, or a combination of mono(meth)acrylate and di(meth)acrylate monomers, in addition to a multifunctional crosslinking agent. As used herein, the phrase "(meth)acrylate monomer" indicates that the recited monomer may be an acrylate or a methacrylate. Some embodiments of the ink compositions further include crosslinking photoinitiators. Jettable ink compositions of the type that may be used to print one or more of the polymeric layers with the addition of QDs and/or SPs are described in U.S. Pat. No. 9,909,022, in U.S. Pat. No. 10,190,018, and in PCT application publication number WO2019079037A1, the entire contents of which are incorporated herein by reference.

The mono(meth)acrylate and di(meth)acrylate monomers are ether and/or ester compounds have thin film-forming properties and spreading properties that render them suitable for use in inkjet printing applications. As components of an ink composition, these monomers can provide compositions that are jettable at a range of inkjet printing temperatures, including room temperature. Generally, for ink compositions useful for inkjet printing applications, the surface tension, viscosity, and wetting properties of the ink compositions should be tailored to allow the compositions to be dispensed through an inkjet printing nozzle without drying onto or clogging the nozzle at the temperature used for printing (e.g., room temperature, ~22° C., or at higher temperatures up to, for example, about 40° C.). Once formulated, various embodiments of the ink compositions can have a viscosity of, for example, between about 2 cps and about 30 cps (including, for example, between about 5 cps and about 10 cps) at the desired jetting temperature and a surface tension of between about 25 dynes/cm and about 45 dynes/cm (including, for example, between about 30 dynes/cm and about 42 dynes/cm and between about 28 dynes/cm and about 38 dynes/cm) at the same temperature.

The suitable viscosities and surface tensions for the individual monomers used in the ink compositions will depend on the viscosities and surface tensions for the other components present in a given ink composition and on the relative amounts of each component in the ink composition. Generally, however, the mono(meth)acrylate monomers and the di(meth)acrylate monomers will have a viscosity in the range from about 4 cps to about 22 cps at 22° C., including about 4 cps to about 18 cps at 22° C., and a surface tension in the range from about 30 dynes/cm to 41 dynes/cm at 22° C., including in the range from about 32 dynes/cm to 41 dynes/cm at 22° C. Methods for measuring viscosities and surface tensions are well known and include the use of commercially available rheometers (e.g., a DV-I Prime Brookfield rheometer) and tensiometers (e.g., a SITA bubble pressure tensiometer).

In some embodiments of the ink compositions, organic solvents can be added to adjust the viscosities and/or surface tensions of the ink compositions if the viscosities and/or surface tensions of the ink compositions fall outside of these ranges in the absence of organic solvents.

Embodiments of the ink compositions useful for forming dome-shaped coupling layers include polymers having a high refractive index or particle-polymer composites having a high refractive index. For these applications, a high refractive index refers to a refractive index of at least 1.5. The particle-polymer composites include high refractive index particles in a polymer matrix. The particles in the composites are sized such that they do not act as scattering particles. By way of illustration, the zirconia nanoparticles sold by Pixelligent can be included in the ink compositions. Typically, the particles in the particle-polymer composites will have diameters of about 20 nm or smaller.

The mono(meth)acrylate monomers and di(meth)acrylate monomers can be, for example, linear aliphatic mono(meth)acrylates and di(meth)acrylates or can include cyclic and/or aromatic groups. In various embodiments of the inkjet printable ink compositions, the mono(meth)acrylate monomers and/or di(meth)acrylate monomers are polyethers. The monomers are desirably polar, low vapor pressure monomers with relatively high boiling points.

Suitable (meth)acrylate monomers include, but are not limited to: alkyl or aryl (meth)acrylates, such as methyl (meth)acrylate, ethyl (meth)acrylate, and benzyl (meth)acrylate; cyclic trimethylolpropane formal (meth)acrylate; alkoxylated tetrahydrofurfuryl (meth)acrylate; phenoxyalkyl (meth)acrylates, such as 2-phenoxyethyl (meth)acrylate and phenoxymethyl (meth)acrylate; and 2(2-ethoxyethoxy) ethyl (meth)acrylate. Other suitable di(meth)acrylate monomers include 1,6-hexanediol diacrylate; 1,12 dodecanediol di(meth)acrylate; 1,3-butylene glycol di(meth)acrylate; di(ethylene glycol) methyl ether methacrylate; and polyethylene glycol di(meth)acrylate monomers, including ethylene glycol di(meth)acrylate monomers and polyethylene glycol di(meth)acrylate monomers having a number average molecular weight in the range from, for example, about 230 g/mole to about 440 g/mole. For example, the ink compositions can include polyethylene glycol 200 dimethacrylate and/or polyethylene glycol 200 diacrylate having a number average molecular weight of about 330 g/mole. Other mono- and di(meth)acrylate monomers that can be included in various embodiments of the ink compositions, alone or in combination, include dicyclopentenyloxyethyl acrylate (DCPOEA), isobornyl acrylate (ISOBA), dicyclopentenyloxyethyl methacrylate (DCPOEMA), isobornyl methacrylate (ISOBMA), and N-octadecyl methacrylate (OctaM). Homologs of ISOBA and ISOBMA (collectively "ISOB(M)A" homologs) in which one or more of the methyl groups on the ring is replaced by hydrogen can also be used.

In various embodiments of the inkjet printable ink compositions, the di(meth)acrylate monomers are alkoxylated aliphatic di(meth)acrylate monomers. These include neopentyl glycol group-containing di(meth)acrylates, including alkoxylated neopentyl glycol diacrylates, such as neopentyl glycol propoxylate di(meth)acrylate and neopentyl glycol ethoxylate di(meth)acrylate. Various embodiments of the neopentyl glycol group-containing di(meth)acrylates have molecular weights in the range from about 200 g/mole to about 400 g/mole. This includes neopentyl glycol-containing di(meth)acrylates having molecular weights in the range from about 280 g/mole to about 350 g/mole and further includes neopentyl glycol-containing di(meth)acrylates having molecular weights in the range from about 300 g/mole to about 330 g/mole. Various neopentyl glycol group-containing di(meth)acrylate monomers are commercially available. For example, neopentyl glycol propoxylate diacrylate can be purchased from Sartomer Corporation under the tradename SR9003B and also from Sigma Aldrich Corporation under the tradename Aldrich-412147 (~330 g/mole; viscosity ~18 cps at 24° C.; surface tension ~34 dynes/cm at 24° C.). Neopentyl glycol diacrylate also can be purchased from Sigma Aldrich Corporation under the tradename Aldrich-408255 (~212 g/mole; viscosity ~7 cps; surface tension ~33 dynes/cm).

Examples of monomers that can form polymeric coupling layers with high indices of refraction include those that form polymeric layers having a refractive index of at least 1.5. Specific examples of such monomers include tricyclodecane dimethanol diacrylate, benzyl methacrylate, bis-phenol-A epoxydiacrylate, phenylthiolethyl acrylate, bis(methacrylolthiophenyl) sulfide, zirconium acrylate, and hafnium carboxyethyl acrylate.

The multifunctional (meth)acrylate crosslinking agents desirably have at least three reactive (meth)acrylate groups. Thus, the multifunctional (meth)acrylate crosslinking agents can be, for example, tri(meth)acrylates, tetra(meth)acrylates, and/or higher functionality (meth)acrylates. Pentaerythritol tetraacrylate or pentaerythritol tetramethacrylate, di(trimethylolpropane) tetraacrylate, and di(trimethylolpropane) tetramethacrylate are examples of multifunctional (meth)acrylates that can be used as a primary cross-linking agent. The term "primary" is used here to indicate that other components of the ink compositions may also participate in crosslinking, although that is not their main functional purpose.

Ink compositions useful for the inkjet printing of QD-containing layers and layers containing scattering particles will further include QDs and/or scattering particles dispersed in the organic binder material. The scattering particles can be, for example, GSPs and/or PSNP. The ink compositions can include more than one type of particle. For example, various embodiments of the ink compositions used to form the light-emission layers contain a mixture of QDs and PSNP; a mixture of QDs and GSPs; or a mixture of QDs, GSPs, and PSNPs. The QD-containing ink compositions used to form a sub-pixel of a certain color (red, green, or blue) will include QDs that convert the light from the LED into that color.

The GSP-containing ink compositions can include more than one type of GSP, where the different types of GSP differ by nominal particle size and/or shape, particle material, or both. Similarly, the PSNP-containing ink compositions can include more than one type of PSNP, where the different types of PSNP differ by nominal particle size and/or shape, particle material, or both.

The QDs optionally include a surface film of capping ligands. These capping ligands, which help to passivate the QDs and stabilize them against agglomeration, are frequently present as a result of the solution phase growth of the QDs. In addition, a second type of ligand, referred to herein as a crosslinkable ligand, may be included in the QD-containing ink compositions. The crosslinkable ligands attach to the QDs, typically via hydrogen bond formation, and also covalently crosslink to the polymer components in the ink composition as it cures. The crosslinkable ligands are monomers characterized in that they have one or more functional groups with polymerizable double bonds, such as acrylate or methacrylate groups, and a functional group which undergoes specific attachment to the surfaces of the QDs in the ink composition. The monomers may further include a spacer chain separating these functional groups. Such bi-functionality of the crosslinkable ligands keeps the QDs dispersed in the curable ink compositions and prevents their re-aggregation during the curing process. For example, monomers containing carboxyl (—COOH), amine (—NR$_2$, where R is an H atom or an alkyl group), and thiol (—SH) groups have strong binding affinities for QDs composed of group II-VI elements. 2-Carboxyethyl acrylate (2CEA) is an example of a crosslinkable ligand for use with octadecylamine-capped core-shell CdSe/ZnS QDs.

In some embodiments of the ink compositions, the mono (meth)acrylate and/or di(meth)acrylate monomers are the primary component in the ink compositions on a weight basis. Various embodiments of these ink compositions have a combined mono(meth)acrylate and di(meth)acrylate monomer content in the range from about 65 wt. % to about 96 wt. %. (That is, the combined weight of all the mono (meth)acrylate and di(meth)acrylate monomers in the ink composition accounts for about 65 wt. % to about 96 wt. % of the ink composition, although the ink composition need not include both mono(meth)acrylate and di(meth)acrylate monomers.) This includes embodiments of the ink compositions having a combined mono(meth)acrylate and di(meth) acrylate monomer content in the range from about 65 wt. % to about 96 wt. % and in the range from about 75 wt. % to 95 wt. %, and further includes embodiments of the ink compositions having a combined mono(meth)acrylate and di(meth)acrylate monomer content in the range from about 80 wt. % to 90 wt. %. Some embodiments of the ink composition include only a single mono(meth)acrylate monomer or a single di(meth)acrylate monomer, while others include a mixture of two or more mono(meth)acrylate monomers and/or di(meth)acrylate monomers. For example, various embodiments of the ink compositions include two mono(meth)acrylate monomers, two di(meth)acrylate monomers, or a mono(meth)acrylate monomer in combination with a di(meth)acrylate monomer. The weight ratios of the two monomers can vary significantly in order to tailor the viscosity, surface tension, and film-forming properties of the ink compositions. By way of illustration, some embodiments of the ink compositions that include two of the mono- or di(meth)acrylate monomers include a first mono(meth) acrylate or di(meth)acrylate monomer and a second mono (meth)acrylate or di(meth)acrylate monomer in a weight ratio in the range from 95:1 to 1:2, including in a weight ratio range from 12:5 to 1:2. This includes embodiments of the ink compositions in which the weight ratio of the first mono(meth)acrylate or di(meth)acrylate monomer to the second mono(meth)acrylate or di(meth)acrylate monomer is in the range from 12:5 to 4:5; further includes embodiments of the ink compositions in which the weight ratio of the first mono(meth)acrylate or di(meth)acrylate monomer to the second mono(meth)acrylate or di(meth)acrylate monomer is in the range from 5:4 to 1:2; and still further includes embodiments of the ink compositions in which the weight ratio of the first mono(meth)acrylate or di(meth)acrylate monomer to the second mono(meth)acrylate or di(meth) acrylate monomer is in the range from 5:1 to 5:4. For the purposes of the weight percentages and weight ratios recited in this paragraph, any crosslinking ligand present in the ink composition is not considered to be a mono(meth)acrylate or di(meth)acrylate monomer.

Some embodiments of the ink compositions that include QDs have a QD concentration in the range from about 0.1 wt. % to about 5 wt. %, including a QD concentration in the range from about 0.5 wt. % to about 2 wt. %, although concentrations outside of these ranges can be employed. The concentration of PSNPs can be very low because even a tiny amount of the PSNPs can make a large difference in the emission properties of a QD-containing layer. Therefore, in an ink composition that contains both QDs and PSNPs, the concentration of PSNPs will generally be substantially lower than the concentration of QDs. By way of illustration, various embodiments of the ink compositions have a PSNP concentration in the range from about 0.01 wt. % to about 5 wt. %, including a PSNP concentration in the range from about 0.01 wt. % to about 1 wt. % and from about 0.02 wt. % to about 0.1 wt. %. By way of illustration, various embodiments of the ink compositions have a GSNP concentration in the range from about 0.01 wt. % to 12 wt. %, including a GSNP concentration in the range from about 1 wt. % to about 10 wt. %.

Other embodiments of the ink compositions for use in printing the QD-containing emission layers may have a higher QD loading than that discussed above. For example, various embodiments of the QD-containing ink compositions have a QD concentration in the range from about 5 wt. % to about 50 wt. %, including a QD concentration in the range from about 10 wt. % to about 35 wt. %. As a result, the mono(meth)acrylate and di(meth)acrylate monomer content of these ink compositions will be lower than discussed above. For example, various embodiments of the QD-containing ink compositions for a color filter may have a mono(meth)acrylate and di(meth)acrylate monomer content in the range from about 50 wt. % to about 90 wt. %. This includes embodiments of the ink compositions having a mono(meth)acrylate and di(meth)acrylate monomer content in the range from about 60 wt. % to 80 wt. % and further includes embodiments of the ink compositions having a mono(meth)acrylate and di(meth)acrylate monomer content in the range from about 65 wt. % to 75 wt. %. An organic solvent may be added to these ink compositions to provide them with a viscosity and/or surface tension suitable for inkjet printing, as discussed above. Suitable organic solvents include esters and ethers. Examples of organic solvents that can be included in the ink compositions include high boiling organic solvents, including organic solvents having a boiling point of at least 200° C. This includes organic solvents that have boiling points of at least 230° C., at least 250° C., or even at least 280° C. Diols and glycols, such as propanediols, pentanediols, diethylene glycols, and triethylene glycols, are examples of high boiling organic solvents that can be used. High boiling aprotic solvents can also be used, including aprotic solvents having boiling points of at least 240° C. Sulfolane, 2,3,4,5-tetrahydrothiophene-1,1-dioxide, also known as tetramethylene sulfone, is an example of a relatively high boiling, aprotic solvent. Other non-limiting exemplary organic solvents can include xylenes, mesitylene, propylene glycol methyl ethers, methyl naphthalene, methyl benzoate, tetrahydronaphthalene, dimethyl formamide, terpineol, phenoxyethanol, and butyrophenone. If organic solvents are included in the ink compositions, the QD and monomer concentrations cited above are based on the solids content of the ink compositions.

For various embodiments of the ink compositions, multifunctional (meth)acrylate crosslinking agents can account for between about 4 wt. % to about 10 wt. % of an ink composition. Generally, the photoinitiators will be included in amounts in the range from about 0.1 wt. % to about 10 wt. %, including amounts in the range from about 0.1 wt. % to about 8 wt. %.

The specific photoinitiators used for a given ink composition are desirably selected such that they are activated at wavelengths that are not damaging to materials used in the fabrication of the device. An acylphosphine oxide photoinitiator can be used, though it is to be understood that a wide variety of photoinitiators can be used. For example, but not limited by, photoinitiators from the α-hydroxyketone, phenylglyoxylate, and α-aminoketone classes of photoinitiators can also be considered. For initiating a free-radical based polymerization, various classes of photoinitiators can have an absorption profile of between about 200 nm to about 400 nm. For various embodiments of the ink compositions and methods of printing disclosed herein, 2,4,6-trimethylbenzoyl-diphenylphosphine oxide (TPO) and 2,4,6-trimethylbenzoyl-diphenyl phosphinate have desirable properties. Examples of acylphosphine photoinitiators include Irgacure® TPO (also previously available under the tradename Lucirin® TPO) initiators for UV curing sold under the tradenames Irgacure® TPO, a type I hemolytic initiator with absorption @ 380 nm; Irgacure® TPO-L, a type I photoinitiator that absorbs at 380 nm; and Irgacure® 819 with absorption at 370 nm. By way of illustration, a light source emitting at a nominal wavelength in the range from 350 nm to 395 nm at a radiant energy density of up to 1.5 J/cm$^2$ could be used to cure an ink composition comprising a TPO photoinitiator. Using the appropriate energy sources, high levels of curing can be achieved. For example, some embodiments of the cured films have a degree of curing of 90% or greater, as measured by Fourier Transform Infrared (FTIR) spectroscopy.

Although various embodiments of the ink compositions include photoinitiators, other types of initiators can be used instead of, or in addition to, the photoinitiators. For example, other suitable cure initiators include thermal initiators and initiators that induce polymerization using other types of energy, such as electron beam initiators.

Given that the initiation of polymerization can be induced by light, ink compositions can be prepared to prevent exposure to light. With respect to preparation of the ink compositions of the present teachings, in order to ensure the stability of various compositions, the compositions can be prepared in a dark or very dimly lit room or in a facility in which the lighting is controlled to exclude wavelengths that would induce polymerization. Such wavelengths generally include those below about 500 nm.

In one illustrative method of formulating a QD-containing and/or SP-containing ink composition, mono(meth)acrylate and/or di(meth)acrylate monomers and the multifunctional (meth)acrylate crosslinking agent are mixed together with a photoinitiator to form an initial curable monomeric blend. If the ink composition will include crosslinkable ligands, they can also be added to the curable monomeric blend. Then QDs and/or GSPs and/or PSNPs are dispersed in the curable monomeric blend to form a dispersion. The QDs and other particles may be added in the form of an aqueous or non-aqueous organic solvent-based dispersion. If so, water or organic solvent optionally can be removed from dispersion to form a second dispersion. The ink composition is then ready for use and should be stored away from light. Once the ink compositions are prepared, they can be dehydrated by mixing in the presence of molecular sieve beads for a period of a day or more and then stored under a dry, inert atmosphere, such as a compressed dry air atmosphere.

The ink compositions can be printed using a printing system, such as that described in U.S. Pat. No. 8,714,719, which is incorporated herein in its entirety. The films can be cured in an inert nitrogen environment using UV radiation, thermal energy, or other forms of energy (e.g., e-beam).

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A pixel comprising:
a substrate;
a red sub-pixel on the substrate, the red sub-pixel comprising:
a first light-emitting diode;
a first coupling layer disposed over the first light-emitting diode, wherein the first coupling layer comprises scattering particles disposed in a polymeric matrix; or is dome-shaped and comprises scattering particles in a polymeric matrix; and
a red light-emission layer comprising red-emitting quantum dots and scattering particles disposed in a polymeric matrix disposed over the first coupling layer;
a green sub-pixel on the substrate, the green sub-pixel comprising:
a second light-emitting diode;
a second coupling layer disposed over the second light-emitting diode, wherein the second coupling layer comprises scattering particles disposed in a polymeric matrix; or is dome-shaped and comprises scattering particles in a polymeric matrix; and
a green light-emission layer comprising green-emitting quantum dots and scattering particles disposed in a polymeric matrix disposed over the second coupling layer; and
a blue sub-pixel on the substrate, the blue sub-pixel comprising:
a third light-emitting diode.

2. The pixel of claim 1, wherein the first light-emitting diode, the second light-emitting diode, and the third light-emitting diode are blue light-emitting diodes.

3. The pixel of claim 2, wherein the blue light-emitting diodes are gallium nitride-based diodes.

4. The pixel of claim 1, wherein the first light-emitting diode, the second light-emitting diode, and the third light-emitting diode are ultraviolet light emitting-diodes, and the blue sub-pixel comprises:
a third coupling layer disposed over the third light-emitting diode, wherein the third coupling layer is: (a) domed-shaped; (b) comprises scattering particles disposed in a polymeric matrix; or (c) dome-shaped and comprises scattering particles in a polymeric matrix; and
a blue light-emission layer comprising blue-emitting quantum dots and scattering particles disposed in a polymeric matrix disposed over the third coupling layer.

5. The pixel of claim 1, wherein the first coupling layer is localized over the first light-emitting diode, the second coupling layer is localized over the second light-emitting diode, or the first and second coupling layers are localized over the first and second light-emitting diodes, respectively.

6. The pixel of claim 1, wherein an emission surface area of the green sub-pixel is larger than an emission surface area of the red sub-pixel, and the emission surface area of the red sub-pixel is larger than an emission surface area of the blue sub-pixel.

7. A pixel comprising:
a substrate;
a red sub-pixel on the substrate, the red sub-pixel comprising:
a first light-emitting diode;
a first coupling layer disposed over the first light-emitting diode, wherein the first coupling layer: (a) is domed-shaped; (b) comprises scattering particles disposed in a polymeric matrix; or (c) is dome-shaped and comprises scattering particles in a polymeric matrix; and
a red light-emission layer comprising red-emitting quantum dots and scattering particles disposed in a polymeric matrix disposed over the first coupling layer;
a green sub-pixel on the substrate, the green sub-pixel comprising:
a second light-emitting diode;

a second coupling layer disposed over the second light-emitting diode, wherein the second coupling layer: (a) is domed-shaped; (b) comprises scattering particles disposed in a polymeric matrix; or (c) is dome-shaped and comprises scattering particles in a polymeric matrix; and a green light-emission layer comprising green-emitting quantum dots and scattering particles disposed in a polymeric matrix disposed over the second coupling layer; and a blue sub-pixel on the substrate, the blue sub-pixel comprising:

a third light-emitting diode, wherein the first coupling layer is separated from the red light-emission layer by an interfacial region having a quantum dot concentration gradient in which the concentration of red-emitting quantum dots in the interfacial region is lower near the first coupling layer than near the red light-emission layer, and/or wherein the second coupling layer is separated from the green light-emission layer by an interfacial region having a quantum dot concentration gradient in which the concentration of green-emitting quantum dots in the interfacial region is lower near the second coupling layer than near the green light-emission layer.

8. A color conversion display device comprising:
a display device substrate;
a plurality of the pixels arranged on the display device substrate, each pixel in the plurality of pixels comprising:
a substrate;
a red sub-pixel on the substrate, the red sub-pixel comprising:
a first light-emitting diode;
a first coupling layer disposed over the first light-emitting diode, wherein the first coupling layer comprises scattering particles disposed in a polymeric matrix; or is dome-shaped and comprises scattering particles in a polymeric matrix; and
a red light-emission layer comprising red-emitting quantum dots and scattering particles disposed in a polymeric matrix disposed over the first coupling layer;
a green sub-pixel on the substrate, the green sub-pixel comprising:
a second light-emitting diode;
a second coupling layer disposed over the second light-emitting diode, wherein the second coupling layer comprises scattering particles disposed in a polymeric matrix; or is dome-shaped and comprises scattering particles in a polymeric matrix; and
a green light-emission layer comprising green-emitting quantum dots and scattering particles disposed in a polymeric matrix disposed over the second coupling layer; and
a blue sub-pixel on the substrate, the blue sub-pixel comprising:
a third light-emitting diode; and
a translucent protective layer disposed over the plurality of pixels.

9. A method of forming a pixel on a substrate comprising a first light emitting-diode, a second light-emitting diode, and a third light-emitting diode, the method comprising:

forming a first sub-pixel confinement feature over the first light-emitting diode;
depositing a first film-forming ink composition comprising scattering particles and curable organic monomers into or onto the first sub-pixel confinement feature over the first light-emitting diode;
drying the first film-forming ink composition to form a first coupling layer;
depositing a first quantum dot-containing ink composition comprising red-emitting quantum dots, scattering particles, and curable organic monomers into or onto the first sub-pixel confinement feature;
drying the first quantum dot-containing ink composition to form a red light-emission layer comprising red-emitting quantum dots and scattering particles disposed in a polymeric matrix;
forming a second sub-pixel confinement feature over the second light-emitting diode;
depositing a second film-forming ink composition comprising scattering particles and curable organic monomers into or onto the second sub-pixel confinement feature over the second light-emitting diode;
drying the second film-forming ink composition to form a second coupling layer;
depositing a second quantum dot-containing ink composition comprising green-emitting quantum dots, scattering particles, and curable organic monomers into or onto the second sub-pixel confinement feature; and
drying the second quantum dot-containing ink composition to form a green light-emission layer comprising green-emitting quantum dots and scattering particles disposed in a polymeric matrix.

10. The method of claim 9, wherein at least one of the first film-forming ink composition, the first quantum dot-containing ink composition, the second film-forming ink composition, and the second quantum dot-containing ink composition is deposited by inkjet printing.

11. The method of claim 9, further comprising curing at least one of the first film-forming ink composition, the first quantum dot-containing ink composition, the second film-forming ink composition, and the second quantum dot-containing ink composition.

12. The method of claim 11, wherein the first film-forming ink composition is cured prior to depositing the first quantum dot-containing ink composition, and/or the second film-forming ink composition is cured prior to depositing the second quantum dot-containing ink composition, and/or the third film-forming ink composition is cured prior to depositing the third quantum dot-containing ink composition.

13. The method of claim 11, wherein the first quantum dot-containing ink composition is deposited before the first film-forming ink composition is cured, and/or the second quantum dot-containing ink composition is deposited before the second film-forming ink composition is cured, and/or the third quantum dot-containing ink composition is deposited before the third film-forming ink composition is cured.

14. The method of claim 9, wherein the first light-emitting diode, the second light-emitting diode, and the third light-emitting diode are blue light-emitting diodes.

15. The method of claim 9, wherein the first light-emitting diode, the second light-emitting diode, and the third light-emitting diode are ultraviolet light-emitting diodes.

16. The method of claim 15, further comprising:
forming a third sub-pixel confinement feature over the third light-emitting diode;

depositing a third film-forming ink composition comprising curable organic monomers into or onto the third sub-pixel confinement feature over the third light-emitting diode;

drying the third film-forming ink composition to form a third coupling layer;

depositing a third quantum dot-containing ink composition comprising blue-emitting quantum dots, scattering particles, and curable organic monomers into or onto the third sub-pixel confinement feature; and drying the third quantum dot-containing ink composition to form a blue light-emission layer comprising blue-emitting quantum dots and scattering particles disposed in a polymeric matrix.

17. A method of forming a color conversion display device, the method comprising forming a plurality of the pixels on a display device substrate, wherein the pixels are formed on the display device substrate using the method of claim 9.

18. A method of forming a display, the method comprising:

forming a plurality of pixels on a semiconductor substrate each pixel comprising a red sub-pixel, a green sub-pixel, and a blue sub-pixel, wherein the pixels are formed by:

forming a first light-emitting diode, a second light-emitting diode, and a third light-emitting diode on the semiconductor substrate;

forming a first sub-pixel confinement feature over the first light-emitting diode;

forming a second sub-pixel confinement feature over the second light-emitting diode;

optionally, forming a third sub-pixel confinement feature over the third light-emitting diode;

forming a red light emission-layer over the first light-emitting diode in the first pixel confinement feature by depositing an ink composition comprising red-emitting quantum dots into or onto the first pixel confinement feature and drying the ink composition into a solid film to provide the red sub-pixel;

forming a green light emission layer over the second light-emitting diode in the second pixel confinement feature by depositing an ink composition comprising green-emitting quantum dots into or onto the second pixel confinement feature and drying the ink composition into a solid film to provide the green sub-pixel; and optionally, forming a blue light emission layer over the third light-emitting diode in the third pixel confinement feature by inkjet depositing an ink composition comprising blue-emitting quantum dots into or onto the blue pixel confinement feature and drying the ink composition into a solid film;

dicing the substrate into pieces, each of the pieces comprising one or more, but not all, of the pixels; and transferring one or more of the pieces to a display substrate.

19. The method of claim 18, wherein the first, second, and third light-emitting diodes are gallium nitride-based light-emitting diodes integrated into the substrate.

20. The method of claim 18, wherein depositing an ink composition comprising red-emitting quantum dots into or onto the first pixel confinement feature and drying the ink composition into a solid film and/or depositing an ink composition comprising green-emitting quantum dots into or onto the second pixel confinement feature and drying the ink composition into a solid film is done before dicing the substrate into pieces.

21. The method of claim 18, wherein depositing an ink composition comprising red-emitting quantum dots into or onto the first pixel confinement feature and drying the ink composition into a solid film and/or depositing an ink composition comprising green-emitting quantum dots into or onto the second pixel confinement feature and drying the ink composition into a solid film is done after dicing the substrate into pieces.

22. The method of claim 18, wherein the green sub-pixels have emission surface areas that are larger than emission surface areas of the red sub-pixels and the emission surface areas the blue sub-pixels.

23. The method of claim 18, wherein at least one of the ink composition comprising red-emitting quantum dots and the ink composition comprising blue-emitting quantum dots is deposited by inkjet printing.

* * * * *